United States Patent [19]
Cronin et al.

[11] Patent Number: 5,466,636
[45] Date of Patent: Nov. 14, 1995

[54] METHOD OF FORMING BORDERLESS CONTACTS USING A REMOVABLE MANDREL

[75] Inventors: John E. Cronin, Milton; Carter W. Kaanta, Colchester; Donald M. Kenney, Shelburne; Michael L. Kerbaugh, Jericho; Howard S. Landis, Underhill; Brian J. Machesney, Burlington, all of Vt.; Paul Parries, Wappingers Falls, N.Y.; Rosemary A. Previti-Kelly, Richmond, Vt.; John F. Rembetski, Austin, Tex.

[73] Assignee: International Business Machines Corporation, Armonk, N.Y.

[21] Appl. No.: 946,993

[22] Filed: Sep. 17, 1992

[51] Int. Cl.⁶ .................................................. H01L 21/44
[52] U.S. Cl. ......................... 437/187; 437/948; 437/233; 437/52
[58] Field of Search .......................... 437/948, 187, 437/948, 228, 233, 52; 148/DIG. 26, DIG. 105, DIG. 104, DIG. 106, DIG. 103

[56] References Cited

U.S. PATENT DOCUMENTS

| | | | |
|---|---|---|---|
| 3,909,325 | 11/1975 | Chunch et al. | 156/662 |
| 3,930,857 | 1/1976 | Bendz et al. | |
| 4,359,816 | 11/1982 | Abbas et al. | |
| 4,702,792 | 10/1987 | Chow et al. | 156/628 |
| 4,910,155 | 3/1990 | Cote et al. | 437/8 |
| 4,944,682 | 7/1990 | Cronin et al. | 437/192 |
| 4,944,836 | 7/1990 | Beyer et al. | 156/645 |
| 4,966,870 | 10/1990 | Barber et al. | 437/228 |
| 4,987,099 | 1/1991 | Flammer | 437/192 |
| 5,021,121 | 6/1991 | Groechel et al. | 156/643 |
| 5,041,887 | 8/1991 | Kumagai et al. | |
| 5,120,677 | 6/1992 | Wakamatsu | 437/164 |

FOREIGN PATENT DOCUMENTS

201706A2  4/1986  European Pat. Off. .

OTHER PUBLICATIONS

"Method of Fabricating a New Merged Stacked Trench Capacitor Memory Cell Structure," Dhong et al., *IBM'TDB*, vol. 34, No. 7B, Dec. 1991, pp. 472–476.

"Producing Integral Via and Pad Metallurgy," David et al., *IBM TDB*, vol. 14, No. 1, Jun. 1971 p. 101.

*Primary Examiner*—Olik Chaudhuri
*Assistant Examiner*—C. Everbart
*Attorney, Agent, or Firm*—Michael W. Starkweather; Lawrence H. Meier

[57] ABSTRACT

A semiconductor fabrication process for forming borderless contacts (130, 170, 172) using a removable mandrel (110). The process involves depositing a mandrel on an underlying barrier layer (100) designed to protect underlying structures (40) formed on a substrate (24). The mandrel is made from a material that will etch at a faster rate than the barrier layer so as to permit the formation of openings in the mandrel to be stopped on the barrier layer without penetrating such layer. After depositing a contact (130) in a first opening (120) formed in the mandrel, a second opening (140) is formed and a second contact (170) is deposited therein. Thereafter, the mandrel is removed and replaced with a layer of solid dielectric material (180).

24 Claims, 3 Drawing Sheets

METHOD OF FORMING BORDERLESS CONTACTS USING A REMOVABLE MANDREL

FIELD OF THE INVENTION

The present invention relates to techniques for forming borderless contacts in semiconductor devices and, more particularly, to a method of forming borderless contacts using a removable mandrel.

BACKGROUND OF THE INVENTION

Traditionally, in the manufacture of integrated circuits, the contacts to polycrystalline silicon and metal structures, and to diffusion regions, are designed such that a border region is provided surrounding the region where the contact is to be formed. Borders around the contacts are used primarily to ensure that under worst-case conditions, the contact openings will never extend beyond the structure or regions with which contact is to be made. If the border is not used, the contacts, due to normal process variations, may fall partially on the desired structure or regions and partially over adjacent structures or regions, thereby forming undesired connections. When this occurs, the field oxide may be consumed during an over etch and a metal-to-substrate leakage path may be formed. Consumption of the field oxide may also result in over-etching of the silicon substrate.

While borders around contact windows ensure proper registration of the contacts and protection of the underlying conductive structures, they have the undesirable effect of limiting the maximum number of integrated circuits that can be packed in a given area. By contrast, as the name implies, a borderless contact does not require a border around a contact. Thus, a borderless contact process allows an increased level of circuit integration, and hence an increased IC chip density.

various techniques have been developed for forming borderless contacts, as disclosed in U.S. Pat. No. 4,944,682 to Cronin et al. and U.S. Pat. No. 4,966,870 to Barber et al. The borderless contact processes described in these patents involve depositing a conformal coating of material on a substrate so as to overlie pre-existing topography (e.g., poly-Si interconnect lines or an FET gate stack) and then depositing a second relatively void-free layer of material on top of the first layer. An opening for the borderless contact is formed in the second layer using an etchant that etches the second layer faster than the first layer, with the etch process generally being terminated when the opening extends entirely through the second layer to the first layer. Thus, the first layer serves as an etch stop for the etching process used to form the opening in the second layer. Then, a second etchant is used to extend the opening through the first layer to the selected underlying structure where contact is to be made.

For borderless contact processes of the type disclosed by Cronin et al. and Barber et al. to function effectively, the etching process used to form the opening in the second layer must be highly selective with respect to such layer. That is, the etching process used to etch the opening in the second layer should etch the second layer at a significantly faster rate than the first layer, with etch rate ratios (ERRs) in the range of at least 40:1 being preferred. Unfortunately, the etch selectivity of known etchants that may be used to etch the first and second layers of material deposited using the processes of Cronin et al. and Barber et al. is not, under certain circumstances, as great as is desired. Thus, slight over etching of the second layer can, in certain process sequences, result in the etching of an opening in the first layer as well as an etching of materials underlying the first layer (which typically are not intended to be etched). Thus, a need exists for a borderless contact process involving layers of materials and etching processes that together provide a higher etch selectivity than is typically available with known borderless contact processes.

In connection with the formation of various semiconductor devices, it is known to deposit a first layer of material on a substrate, form openings in the first layer, deposit conductive material in such openings and finally remove the first layer, as disclosed in IBM Technical Disclosure Bulletin, Vol. 14, No. 1, June 1971, U.S. Pat. No. 3,930,857 to Bendz et al. and U.S. Pat. No. 4,359,816 to Abbas et al. However, these known techniques for forming conductive structures in a layer that is subsequently removed are not directed to techniques for forming borderless contacts. Furthermore, these processes do not involve the sequential formation of contacts in the layer of material and then the removal and replacement of material with a different material.

It is known to couple the node electrode of a trench-type capacitor with an adjacent diffusion region using a strap of material extending from the diffusion region to the node electrode, as disclosed in U.S. Pat. No. 5,041,887 to Kumagai et al. Furthermore, techniques have been developed for forming such a strap so that it makes contact both on top of the diffusion region and on a side of the diffusion region intersecting the trench in which the capacitor is formed, as disclosed in IBM Technical Disclosure Bulletin, Vol. 34, No. 7B, December 1991, and European Patent Application No. 201,706 (NEC Corporation).

SUMMARY OF THE INVENTION

The present invention is a process of forming borderless contacts using a removable mandrel. In one embodiment of the process, a mandrel is formed on a substrate. Next, a portion of the mandrel is removed to form a first opening. Thereafter, a conductive material is deposited in the first opening. Then, another portion of the mandrel is removed to form a second opening in which conductive material is deposited. Finally, the mandrel is removed and replaced with a solid dielectric material.

In a specific application of the above-described process, after depositing the mandrel, an opening is formed therein intersecting a trench-type capacitor and an adjacent diffusion region. Next, a conductive material, such as doped semiconductor material is deposited in the opening so as to form a strap that contacts (1) the semiconductor material in the trench, (2) portions of the diffusion region confronting the top surface of the diffusion region, and (3) portions of the sidewall of the trench. Then, the substrate is heated for a time and at a temperature sufficient to cause impurities in the diffusion implant region to diffuse into adjacent regions of the substrate such that the out-diffused region contacts the portion of the layer of conductive material in the trench, thereby making horizontal and vertical contact with the diffusion region. Finally, the mandrel is removed and replaced with solid dielectric material.

By using a removable mandrel, materials and etching processes may be selected to provide an etch selectivity sufficient to permit the etching of an opening in one layer, which etching may be controllably and repeatably stopped upon reaching an underlying layer. As a result of this etch selectivity, the present invention provides a method of forming borderless contacts that is practical, very controllable and is useable on a manufacturing basis.

BRIEF DESCRIPTION OF THE DRAWINGS

The foregoing and other objects, features and advantages of the invention will be apparent from the following detailed description of the invention, as illustrated in the accompanying drawings, in which.

In the drawings, the relative thicknesses of the various layers and structure illustrated is not necessarily to scale.

DETAILED DESCRIPTION OF THE INVENTION

The present invention is a method of forming borderless contacts using materials that etch at sufficiently different rates when exposed to an appropriate etching process as to permit the process to be used on a repeatable, highly controllable basis in a manufacturing environment. The method may be used for forming contacts that connect adjacent structure, i.e., a diffusion region and a trench capacitor, and may also be used in forming a unitary contact for connecting an underlying conductive structure with overlying conductive structure.

FIGS. 1–8 illustrate a preferred embodiment of the present process for forming borderless contacts. The following description of the present invention commences after semiconductor fabrication processes needed to create the structure illustrated in FIG. 1 have been completed. For the purpose of describing the present invention, it is assumed that impurities have been implanted in diffusion regions 20 and 22 using known implantation processes, but have not yet been out-diffused.

Figure 1:
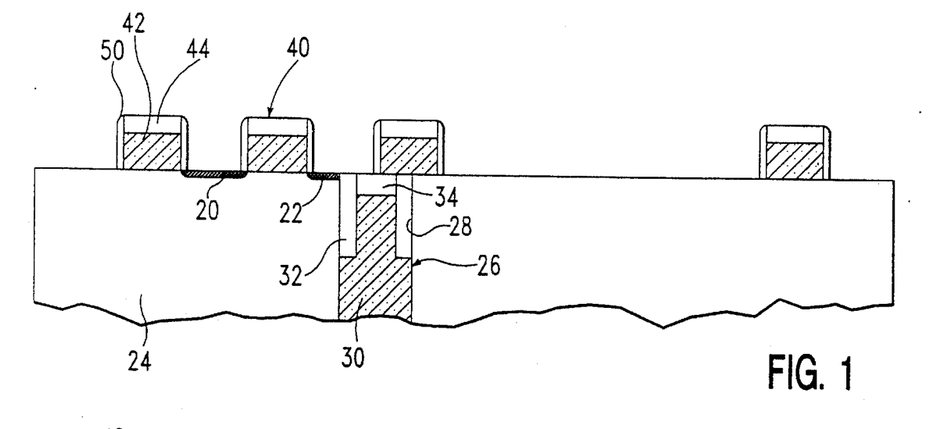
FIG. 1 is a cross-sectional view of integrated circuit structure fabricated prior to the first step of the process of the present invention, which preexisting structure is used in connection with such process.

Also, prior fabrication processes have resulted in the creation of trench capacitor 26 in substrate 24 such that the trench 28 in which the capacitor is formed intersects or is positioned adjacent diffusion region 22. Capacitor 26 includes a semiconductor material 30, such as intrinsic polycrystalline silicon ("poly-Si"), which is used to fill trench 28 and functions as the node electrode. Capacitor 26 also includes a collar 32 and trench cap 34, both of which may be made from silicon oxide.

Gate stack structures 40 have been formed on the surface of substrate 24. The gate stacks include a thin gate dielectric layer (not shown) on top of which a layer 42 of conductive material, e.g., poly-Si, has been deposited. Layer 42 is covered with a dielectric cap layer 44, which layer is made, for example, of $Si_3N_4$. Nitride sidewall spacers 50 are also provided on the sides of gate stack structures 40.

The foregoing structure was formed using known processes not forming part of the present invention. The structure has been described as a starting point from which the method of the present invention proceeds. However, as will be apparent from the following description of the present invention, a wide range of semiconductor fabrication steps may be performed prior to commencing use of the present method. Thus, the present invention may be used in connection with a significant variety of preexisting structures.

In a broad sense, the present invention involves depositing a barrier layer on top of, and in the openings between, preexisting topography and then depositing a mandrel layer on top of the barrier layer. Next, a first opening is formed in the mandrel and barrier layers and a conductive material is deposited in this opening. Then, a second opening is formed in the mandrel and barrier layers and a conductive material is deposited in the second opening. Finally, the mandrel is removed and replaced with a solid dielectric material. It is the use of a removable mandrel together with (1) the selection of materials for the barrier layer and the mandrel and (2) the etching processes used to form the openings in the mandrel that form important aspects of the present invention.

Figure 2:
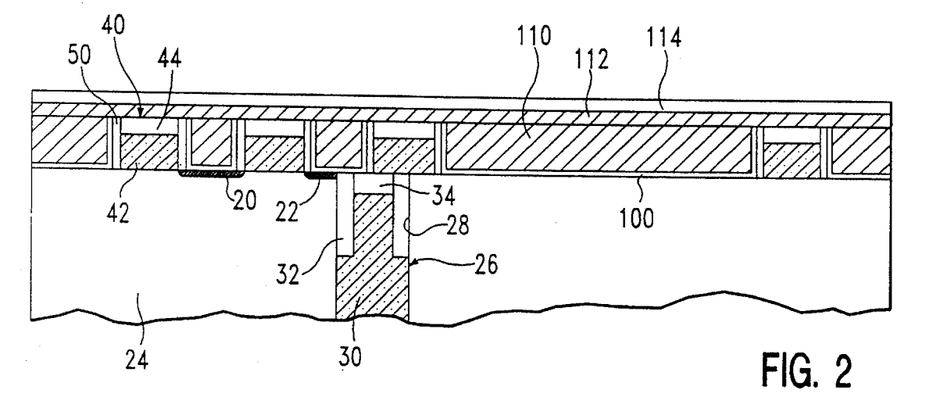
FIG. 2 is similar to FIG. 1, except that the mandrel, mandrel extension, and etch mask layer have been deposited between and above the preexisting structure.

Referring to FIG. 2, as a first step in an exemplary embodiment of the present invention, a layer of material 100 is conformally deposited over the topography illustrated in FIG. 1. The composition of layer 100 is selected so that it will be removed at a significantly slower rate than the material used for mandrel 110, as discussed hereinafter, when subjected to the etching process used to form openings in the mandrel. In this regard, layer 100 functions as a barrier layer for preventing underlying structure from being inadvertently etched during the formation of openings in mandrel 110. Preferably, barrier layer 100 consists of a 30 nm thick layer of nitride deposited by low pressure chemical vapor deposition ("LPCVD"). Alternatively, layer 100 may comprise a somewhat thinner layer of nitride, e.g., 15 nm thick, and a somewhat thicker layer of oxide, e.g., 25 nm thick, deposited on top of the nitride layer. The oxide layer may be deposited by known LPCVD TEOS processes. Although not illustrated in FIG. 2, layer 100 may extend on top of nitride cap 44 of the gate stacks 40. However, in some cases, portions of layer 100 positioned on top of cap 44 are removed as a consequence of the planarization of mandrel 110, as discussed hereinafter.

Next, mandrel 110 is formed by depositing a relatively thick layer of material on barrier layer 100 using, for instance, conventional LPCVD processes. The thickness of the layer of material used to form mandrel 110 will vary as a function of the horizontal spacing between gate stack structure and other topography, with the objective being to entirely fill regions between the topography up to the top surface thereof. Typically, mandrel 110 has a thickness equal to at least the height of the gate stacks (or other structures). Additionally, in relatively dense arrays of gate stacks, the thickness of mandrel 110 is typically on the order of at least about half of the horizontal spacing between adjacent gate stacks. For example, in one embodiment of the invention, where the greatest spacing between adjacent gate stacks is 1.3 microns, an 800 nm thick layer of material is deposited to form mandrel 110. When a relatively dense array of gate stacks is not present, e.g., when the process is used to form support circuitry, it may be necessary to (1) use dummy structures within the relatively large spaces between adjacent gate stacks or (2) deposit mandrel 110 to a greater thickness, e.g., 1 micron thick, to ensure the regions between vertical topography aye filled with the mandrel material.

The material used for mandrel 110 is selected to have an etch rate ratio ("ERR") that is preferably 60:1 or more relative to barrier layer 100 for an appropriate etching process, as discussed hereinafter. In this regard, intrinsic poly-Si is the preferred material for mandrel 110 because known etching processes, such as anisotropic dry etches, as described below, have an etch rate ratio between (1) intrinsic poly-Si and (2) silicon nitride or silicon dioxide ranging from 60:1 to 100:1. However, other materials, such as suitable polyimides, may also be used for mandrel 110, the primary requirement being that the other materials are etchable at a faster rate than the materials used for barrier layer 100 when exposed to an appropriate etch process.

Next, mandrel 110 is planarized back to the nitride barrier layer 100 on top of gate stacks 40 using appropriate processes, such as chemical-mechanical polishing ("CMP") of the type disclosed in U.S. Pat. No. 4,910,155 to Cote et al., issued Mar. 20, 1990, and U.S. Pat. No. 4,944,836 to Beyer et al., issued Jul. 31, 1990.

Following the planarization of mandrel 110, a mandrel extension 112 is deposited on top of mandrel 110. Preferably, mandrel extension 112 is made from the same material as mandrel 110, e.g., intrinsic poly-Si. As described hereinafter, mandrel extension 112 serves an an etch stop layer for follow-on etch processes. Although the thickness of mandrel extension 112 will vary to some extent based on the etch processes for which the extension will function as an etch stop, and as a function of other follow-on processes, a thickness of about 90–110 nm is preferred. Extension 112 is typically deposited by conventional LPCVD processes.

Then, an etch mask layer 114 is deposited on top of mandrel extension 112. The thickness and composition of the material used for layer 114 is selected so as to be resistant to etch processes employed in forming openings in mandrel 110 and extension 112, as discussed hereinafter. Suitable materials for layer 114 include silicon dioxide and silicon nitride. In a preferred embodiment, etch mask layer consists of a TEOS oxide layer deposited on extension 112 to a thickness of 350±35 nm.

As described above, the preferred process sequence for the present invention involves depositing a mandrel, preferably made of intrinsic poly-Si, planarizing the mandrel back to the top of the gate stacks, depositing a mandrel extension preferably made of intrinsic poly-Si, on the mandrel, and then depositing an etch mask layer, preferably made of oxide, on the mandrel extension. However, under certain circumstances, it may be desirable to deposit the etch mask layer directly on the planarized mandrel, which etch mask layer is preferably made of silicon nitride or silicon oxide. Openings are then formed in the mandrel by first forming openings in the oxide or nitride mask layer, stopping on the mandrel. Then, as discussed above, an opening is formed in the mandrel.

Figure 3:
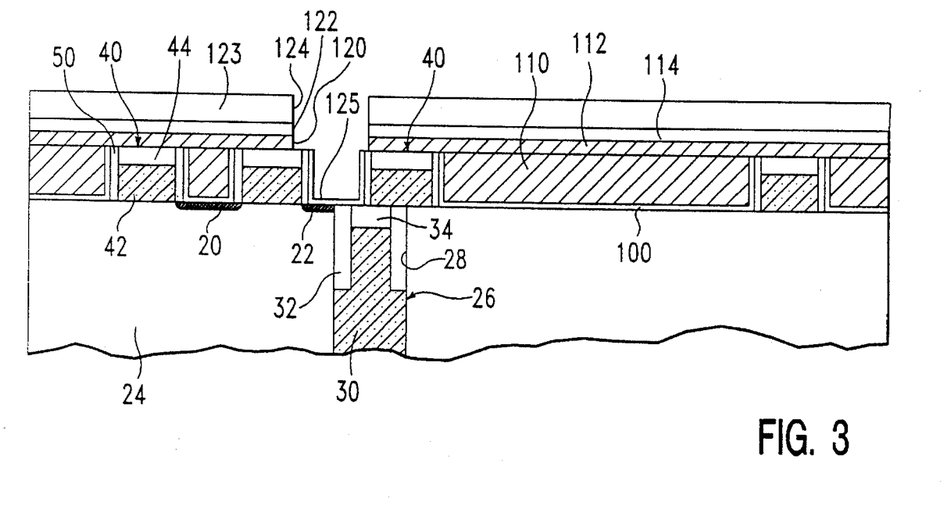
FIG. 3 is similar to FIG. 2, except that a first opening has been formed in the mandrel, mandrel extension and etch mask layer.

Referring to FIG. 3, a first opening 120 is then formed in mandrel 110 and extension 112, as described below. Contacts will later be deposited in opening 120 for (1) coupling structure located within or below mandrel 110 with structure positioned above the mandrel and (2) interconnecting structure within or below mandrel 110, as described hereinafter. Although the first opening 120 may be used in forming contacts to a variety of structures, as described hereinafter opening 120 is used to define a region in which a strap is formed coupling trench capacitor 26 and adjacent diffusion region 22.

In preparation for forming first opening 120, an opening 122 is provided in etch mask layer 114 overlying the portion of mandrel 110 and extension 112 is to be formed. Opening 122 is formed by depositing a layer of photoresist 123 on layer 114 and then forming an opening 124 in the photoresist layer overlying the portion of layer 114 where opening 122 is to be formed. Opening 122 is then formed through opening 124 in photoresist layer 123 using an etch process that has good selectivity between layer 114 and extension 112, i.e., an etching process that permits extension 112 to function as an etch stop. In one embodiment of the invention, where etch mask layer 114 consists of TEOS oxide and extension 112 consists of intrinsic poly-Si, opening 122 is formed by a reactive ion etch ("RIE") process using a single wafer etch ("SWE") tool in a $CHF_3/CF_4/Ar$ ambient stopping on extension 112. The photoresist layer 123 is then stripped off etch mask layer 114 using known wet strip processes.

Using layer 114 as a mask, opening 120 is then formed in extension 112 and mandrel 110 using an etching process that removes the mandrel and extension at a significantly faster rate than barrier layer 100, as discussed above. Throughout the process, whenever openings are to be formed in intrinsic poly-Si mandrel 110 and extension 112, RIE etch processes performed using one of three broad categories of ambients is preferred due to the high selectivity of such processes between (1) intrinsic poly-Si and (2) oxide or nitride. The first category is a fluorine-based ambient (when an isotropic etch can be used), the second category is a chlorine-based ambient (when an anisotropic etch is preferred), and the third category is an halogen-based ambient with the addition of chlorine or fluorine (when even higher selectivity as between intrinsic poly-Si and oxide or nitride is desired). Often halogens are mixed, e.g., HBr, to obtain optimum anisotropicity and suitable etch selectivity.

Preferably, opening 120 is RIE etched in a two step process. As the first step, a RIE etch process is employed that removes mandrel 110 and extension 112 at a relatively high etch rate, but has a low selectivity as between (1) mandrel 110 and extension 112 and (2) native oxide (not shown) present at the interface of mandrel 110 and extension 112. RIE etching in a $Cl_2/HBr$ ambient using a SWE tool may, for example, be used for this first step in the formation of opening 120. This first step in the etch process is terminated before enough of mandrel 110 is removed to expose the portion 125 of barrier layer 100 underlying opening 120. Then, as a second step, the remainder of mandrel 110 in opening 120 is removed using an etch process that has a high etch selectivity between (1) mandrel 110 and extension 112 and (2) barrier layer 100. Assuming barrier layer 100 consists of an underlying silicon nitride layer and an overlying silicon oxide layer and the mandrel 110 consists of intrinsic poly-Si, a suitable etch process having the high etch selectivity desired, may, for example, consist of RIE etching the remaining mandrel portion using a RIE etch in a $Cl_2/HBr/He_2/O_2$ ambient using a SWE tool. The selectivity of the etch may adjusted by varying the relative amount of $O_2$, as required.

As an alternative, under certain circumstances, it may be desirable to form opening 120 in mandrel 110 and extension 112 using a one-step etch process, which necessarily would require using an etch process having a high selectivity between (1) mandrel 110 and extension 112 and (2) barrier layer 100. The etch process for removing the remaining portion of mandrel 110, described above, may, for example, be used in the one-step etch process.

Next, portion 125 of barrier layer 100 positioned at the bottom of opening 120 is removed so as to expose (1) portions of trench collar 32 and trench cap 34 and (2) diffusion region 22. Conventional $CHF_3/CF_4/Ar$ RIE processes may be used to remove portion 125.

After removing barrier layer portion 125, a thin nitride liner (not shown) is deposited in opening 120 for preventing the out-diffusion of impurities in an interconnect strap 130 (described hereinafter) to be formed in opening 120 into adjacent portions of mandrel 110. In this regard, although not illustrated in the Figures, mandrel 110 exists both behind and in front of opening 120 (as well as to the left and right of the opening, as illustrated in the Figures). Such out-diffusion is undesirable because etch processes used to remove mandrel 110, as described hereinafter, may not remove the portions of the mandrel into which impurities have out-diffused. Preferably, the nitride liner has a thickness ranging from 10 to 30 nm and is deposited by LPCVD processes.

The portions of the nitride liner existing on horizontal surfaces in opening 120, e.g., on top of diffusion region 22 and oxide collar 32 and cap 34, are then removed using an etch process that etches nitride significantly faster than silicon. For instance, horizontal portions of the nitride liner may be removed using a RIE etch in a $CHF_3/O_2$ ambient. As discussed hereinafter, the horizontal portions of the nitride liner are removed to permit electrical contact to be made between diffusion region 22 and strap 130 that couples the diffusion region with capacitor 26. Removal of the horizontal portions of the nitride liner also facilitates the subsequent removal of portions of oxide collar 32 and cap 34.

Figure 4:
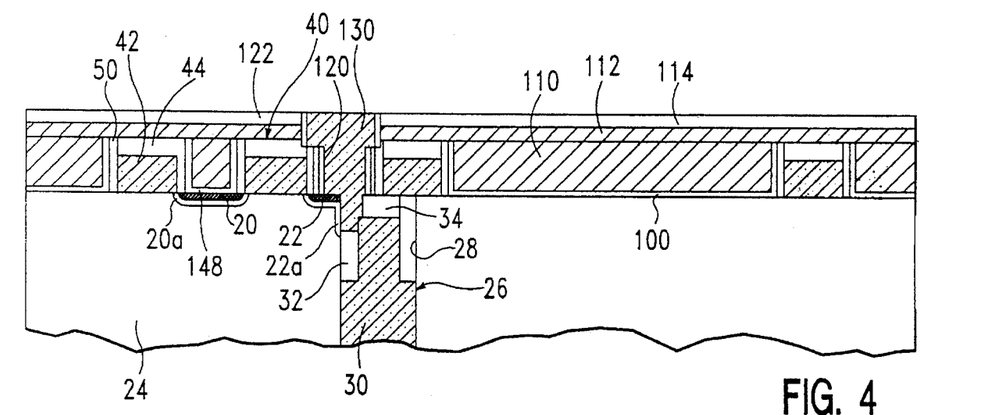
FIG. 4 is similar to FIG. 3, except that an interconnect strap has been deposited in the first opening.

Thereafter, as illustrated in FIG. 4, portions of trench collar 32 and trench cap 34 are removed so as to expose dielectric fill 30 of capacitor 26, also using known RIE etch processes. Because some of etch mask layer 114 will typically be removed during the removal of collar 32 and cap 34, it is important that layer 114 be deposited to a thickness sufficient to permit the layer to be used again as a mask layer in connection with the formation of additional openings in mandrel 110 and extension 112, as discussed hereinafter.

As the next step in the process, a strap 130 is formed connecting diffusion region 22 with capacitor electrode 30. Assuming a P+ strap is desired, a conformal layer of P+ poly-Si is deposited in openings 120 and 122 and on top of etch mask layer 114 (the portion of the P+ poly-Si on top of layer 114 is not shown). If desired, the P+ poly-Si layer used to form strap 130 may be deposited to a thickness sufficient to permit the layer to function as a mandrel extension, thereby avoiding the need for intrinsic poly-Si extension 112 and etch mask layer 114. In such case, a relatively thin (30 nm) barrier layer of nitride (not shown) may be deposited on top of mandrel 110 and gate stacks 40, assuming the mandrel has been previously planarized back to the top surfaces of the gate stacks. The P+ poly-Si "extension" layer is then deposited on top of the nitride layer to a desired thickness, e.g., 200 nm, in connection with the deposition of strap 130. A second opening 140 may then be formed extending through the P+ poly-Si "extension" layer and into mandrel 110, as described in more detail hereinafter in connection with the description of the formation of opening 140.

Regardless of the technique used for forming an extension layer on top of mandrel 110, at this stage in the process, the P+ strap 130 primarily makes contact with the diffusion region 22 along the horizontal surface thereof. That is, the portion of the diffusion region 22 intersecting the top surface of substrate 24 makes only incidental contact with that portion of diffusion region 22 intersecting opening 28 in which capacitor 26 is formed. However, the impurities in diffusion regions 20 and 22 are next out-diffused so as to form out-diffusion regions 20A and 22A (FIG. 4). For instance, assuming diffusion regions 20 and 22 are formed using implanted boron, such out-diffusion may be performed using a rapid thermal anneal process, e.g., RTA at 900° C. for 2–3 minutes. As a result of this out-diffusion, P+ strap 130 now makes contact with out-diffusion region 22A along the portion thereof intersecting the wall of trench 28.

Thus, after the out-diffusion, P+ strap 130 forms a highly robust strap with diffusion regions 20 and 22 because it intersects both horizontal and vertical portions of the diffusion region. Such horizontal and vertical contact is advantageous insofar as it permits a relatively large amount of horizontal (as viewed in the Figures) misalignment to occur in the placement of trench capacitor 26 with respect to the adjacent gate stack (i.e., the gate stack 40 positioned immediately to the left of capacitor 26, as illustrated in FIG. 1–8) while still maintaining electrical contact between strap 130 and diffusion region 22. Thus, even if the gate stack 40 immediately to the left of capacitor 26 is misaligned (i.e., moved to the right, from the perspective of the Figures) so that it covers the majority of diffusion region 22, good electrical contact between strap 130 and the diffusion region will be ensured due to the vertical connection of the strap with the portion of the diffusion region intersecting trench 28.

Figure 5:
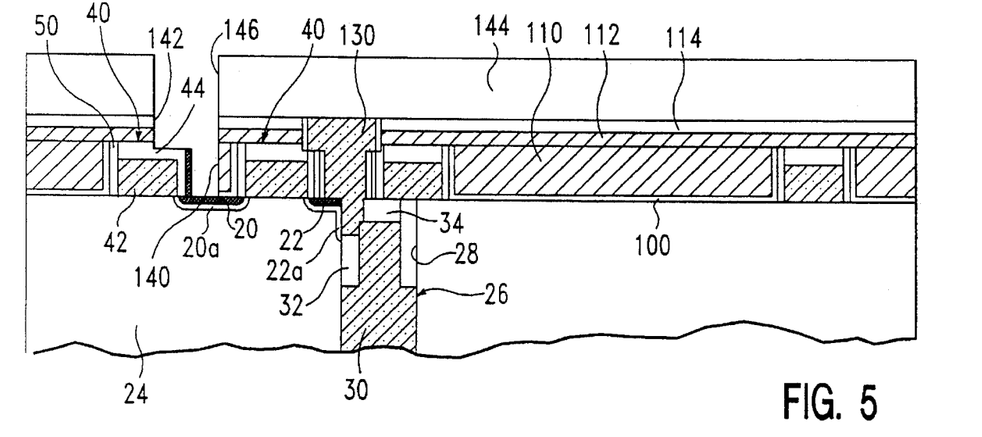
FIG. 5 is similar to FIG. 4, except that a second opening has been formed in the mandrel, mandrel extension, and etch mask layer.

Referring to FIG. 5, as a next major step in the process of the present invention, a second opening 140 is formed in mandrel 110. As with first opening 120, second opening 140 may be used to receive contacts for interconnecting two structures positioned beneath mandrel 110 or for connecting structure positioned below mandrel 110 with structure positioned above mandrel 140. However, one suitable use for second opening 140, as described hereinafter, is to receive a contact stud intersecting a diffusion region.

Prior to forming opening 140, an opening 142 is provided in etch mask layer 114 overlying the area where opening 140 is to be formed by first depositing a layer of photoresist 144 on layer 114. Then, an opening 146 is formed in photoresist layer 144 overlying the portion of layer 114 where opening 142 is to be formed. Opening 142 is then formed through opening 146 in photoresist layer 144 using an etch process that has good selectivity between layer 114 and extension 112. Assuming layer 114 is an oxide and extension 112 is intrinsic poly-Si, opening 142 may, for example, be formed using a RIE process in a $CHF_3/CF_4/Ar$ ambient stopping on mandrel extension 112. Photoresist layer 144 is then stripped off layer 114 using known wet strip processes.

Opening 140 is then formed in extension 112 and mandrel 110 through opening 142 using layer 114 as a mask. Such opening is formed using etching processes identical to those used in forming opening 120, as described above. The etching process is continued until portion 148 (FIG. 4) of barrier layer 100 (positioned at the bottom of opening 140) is reached, which portion functions as an etch stop due to the high selectivity of the etching process. Then, portion 148 is removed, e.g., using RIE processes of the type used to remove portion 124 of barrier layer 100 from the bottom of opening 120, as discussed above.

When a P+ poly-Si "extension" layer and an underlying barrier layer are used in place of mandrel extension 112 and etch mask layer 114, as discussed above, a slightly different process is followed in forming opening 140. As the first step, an opening (similar to opening 142 in layer 114) is formed in P+ poly-Si "extension" layer using known photoresist/mask processes and etching processes that etch P+ poly-Si significantly faster than nitride, e.g., a RIE etch process in a $Cl_2$/HBr ambient. An opening is then formed in the thin barrier layer so as to expose mandrel 110, using an etching process that etches nitride faster than intrinsic poly-Si, e.g., a RIE process in a $CHF_3/O_2$ ambient. Opening 140 is then formed in mandrel 110 following the process described above.

Figure 6:
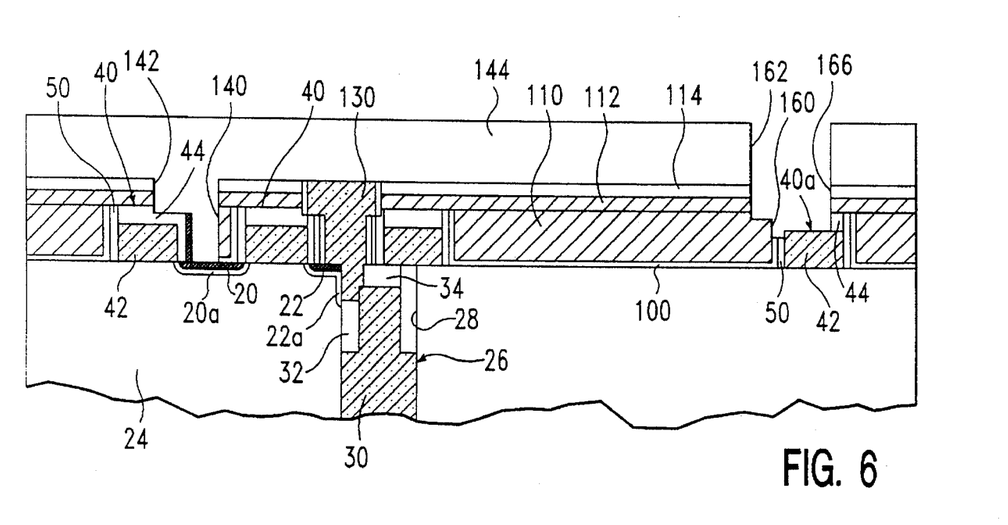
FIG. 6 is similar to FIG. 5, except that a third opening has been formed in the mandrel, mandrel extension, and etch mask layer.

If desired, opening 140 could now be filled with a contact for coupling diffusion region 20 with structure positioned above mandrel 110. However, because the present invention may be used to form borderless contacts that do not extend entirely through the mandrel, as described hereinafter, and in a typical process sequence such contacts would generally be deposited at the same time a contact is deposited in opening 140, the latter is left open during the follow-on process steps described hereinafter.

one example of a contact that does not extend entirely through the mandrel and may be formed in accordance with the present invention is a contact to a gate, such as the gate of stack 40a (FIG. 6). Such a contact may be formed by creating a third opening 160 (FIG. 6) in mandrel 110 and extension 112, and then depositing the contact in the third opening. Opening 160 may be formed using processes similar to those used in forming the first opening 120 and second opening 140, as discussed above. Summarizing the process steps that may be used in forming opening 160, an opening 162 is formed in photoresist layer 164, and layer 164 is used as a mask in forming an opening 166 in layer 114. After stripping off photoresist layer 164, layer 114 is used as a mask in forming opening 160. The latter is formed using an etching process having adequate selectivity between the intrinsic poly-Si of mandrel extension 112 and nitride cap 44 and sidewalls 50 of gate stack 40a so as to permit the etching process to stop on the cap and sidewalls. A suitable etching process, for example, involves RIE etching mandrel extension 112 in a $Cl_2$/HBr ambient. Portions of nitride cap 44 and nitride sidewalls 50 are then removed using an etching process that stops on conductive layer 42 of gate stack 40a. A suitable etching process for removing these portions of the cap and sidewalls of the gate stack 40a consists of RIE etching in a $CHF_3/O_2$ ambient, assuming mandrel 110 and extension 112 are made of intrinsic poly-Si.

Figure 7:
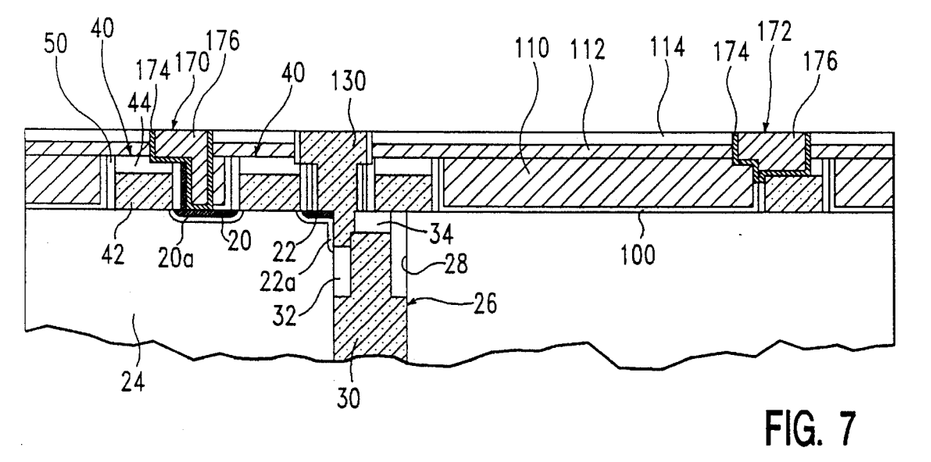
FIG. 7 is similar to FIG. 6, except that contacts have been deposited in the second and third openings.

Referring to FIG. 7, diffusion contact 170 and gate contact 172 are then formed in openings 140 and 160, respectively. Such contacts may be formed, for instance, by first depositing a TiN underlayer 174 and then filling the remainder of the opening with tungsten fill 76. Known CVD or other processes may be used in depositing the TiN and tungsten materials. Typically, such tungsten deposition occurs as a two step process, with the first step being performed using $SiH_4/WF_6$ gas and the second step being performed using $WF_6/H_2$ gas. As those of ordinary skill in the art will appreciate, other metals, as well as semiconductor materials, may also be used to form contacts 170 and 172.

Preferably, contacts 170 and 172 are then planarized using a CMP process that stops on oxide etch mask layer 114.

Figure 8:
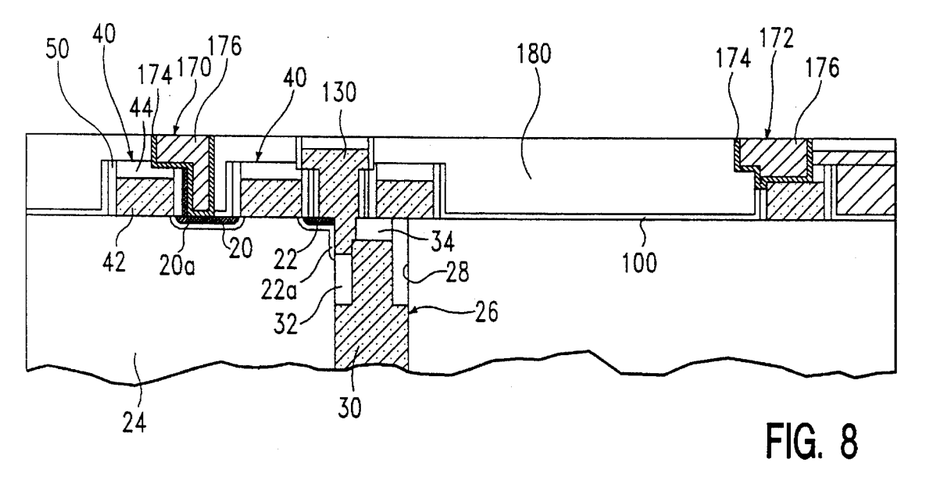
FIG. 8 is similar to FIG. 7, except that the mandrel, mandrel extension and etch mask layer have been removed and the mandrel and mandrel extension have been replaced with a layer of solid dielectric material.

Thereafter, plug 130 is recessed below the top surface of gate stack structures 40, as illustrated in FIG. 8. If desired, the recessed plug 130 may now be capped with oxide or other dielectric, although it is preferred that the plug remain uncapped until later in the process, as described hereinafter.

Layer 114 is then removed using an etch process that stops on the intrinsic poly-Si of extension 112. A suitable process, for example, comprises RIE etching layer 114 in a $CHF_3/CF_4$/Ar ambient.

Mandrel 110 and extension 112 are then removed using an etch process that has a high selectivity between (1) intrinsic poly-Si and (2) the material of barrier layer 100 and the materials of contacts 170 and 172. Assuming strap 130 is made from P+ poly-Si which is not capped with an oxide layer, as discussed above, intrinsic poly-Si mandrel 110 and extension 112 may be removed using a wet etch comprising potassium hydroxide ("KOH") dissolved in isopropyl alcohol ("IPA"). Preferably, the wet etch is a solution of $H_2O$, KOH and IPA, comprising 5–20%, preferably about 10%, of KOH (by weight) in $H_2O$ and about 0.5–10%, preferably about 2%, of IPA (by volume) in the wet etch solution.

After removing the residual etchant with a suitable wet clean, such as a water rinse, a solid dielectric layer 180 is deposited to a suitable thickness so as to fill all spaces formed by the removal of mandrel 110, extension 112 and the recessed space above strap 130. The material used as dielectric layer 180 should be selected based on (1) its ability to fill the vanishingly small openings existing between gate stacks and other structures and (2) its insulative and dielectric properties. Preferably, known spin on glasses are used as dielectric layer 180. Alternate dielectric materials that may be used for layer 180 include polyimides, highly conformal CVD oxides, reflowable oxides, and "dep etches." Preferably, layer 180 is deposited to a thickness such that the top surfaces of contacts 170 and 172 are positioned slightly above the top surface of layer 180.

The deposition of layer 180 completes the process of the present invention. However, known follow-on process steps may include, for example, (1) planarization of dielectric layer 180 by CMP or other known means and (2) the deposition of another dielectric layer (not shown) on top of layer 180 followed by the deposition of metallurgy (not shown) coupled with contacts 170 and 172 in the dielectric layer deposited on layer 180.

An important advantage of using a removable mandrel in connection with the formation of borderless contacts is that it becomes possible to select a material in which the contacts are formed that will etch at a faster rate than an underlying barrier layer when subjected to an appropriate etching process. Such selection of material for the removable mandrel may be made substantially irrespective of the insulative and dielectric characteristics of the material. By contrast, known layers of dielectric material that are deposited and not later removed must have relatively good insulative properties and suitable dielectric characteristics. Such known dielectric materials typically cannot be made to etch sufficiently faster than the underlying barrier layer to permit the etching process to repeatably stop on such layer. On the other hand, a removable mandrel made of intrinsic poly-Si etches significantly faster than typical materials used for barrier layer 100 (e.g., nitrides and oxides) when used with etching processes of the type described above. As a result of such high etch rate of intrinsic poly-Si, the process of the present invention may be used to form borderless contacts in a highly controllable, repeatable and manufacturable manner, unlike other known techniques for forming borderless contacts.

The removable mandrel process of the present invention also eliminates one source of shorting of contacts that extend in or through a layer of dielectric material. Such shorting occurs because it tends to be relatively difficult to deposit a void-free layer of dielectric material using conventional semiconductor fabrication processes. Thus, during the formation of contact openings in a dielectric layer, voids are exposed. These voids, depending upon their placement with respect to the contact opening, may fill with metal or semiconductor material during the formation of the contact, which conductive material will, under certain circumstances short circuit the contact with adjacent conductive structure. On the other hand, because intrinsic poly-Si may be deposited in a highly void-free manner using conventional semiconductive processes, subsequent deposition of the contacts will not result in the formation of stray conductive material that can cause short circuits with adjacent structure. Even if the dielectric material used to replace the intrinsic poly-Si mandrel does include voids, such voids will not result in shorting of the contacts because the entire contact structure has already been formed.

The foregoing description of the invention involves the use of mandrel 110 in the sequential formation of three different openings in the mandrel. However, it is to be appreciated that a greater or lesser number of openings may be formed in the mandrel, as required by the process of interest.

While the invention has been particularly shown and described with reference to preferred embodiments thereof, it will be understood by those skilled in the art that various changes in form and details may be made therein without departing from the spirit and scope of the invention.

What is claimed is:

1. A semiconductor fabrication process comprising the steps of:
   (a) forming a mandrel on a surface;
   (b) removing a first portion of said mandrel to form a first opening;
   (c) depositing a conductive material in said first opening;
   (d) removing a second portion of said mandrel to form a second opening; and
   (e) removing said mandrel and replacing it with a solid dielectric material.

2. A process according to claim 1, further comprising, after said step (d) and before said step (e), the step of depositing a conductive material in said second opening.

3. A process according to claim 1, wherein said first opening extends entirely through said mandrel.

4. A process according to claim 1, wherein said second opening extends entirely through said mandrel.

5. A process according to claim 1, wherein said mandrel is made from a first; material, further wherein said step (e) is performed using an etching process that removes said first material at a faster rate than it removes said conductive material deposited in said first opening.

6. A process according to claim 1, wherein said first and second openings are formed in said mandrel using a dry anisotropic etch having high selectivity between intrinsic poly-Si and dielectric materials.

7. A process according to claim 5, wherein said mandrel is made from intrinsic poly-Si, said conductive material is made of P+ poly-Si and said etching process is a wet etch comprising a solution of $H_2O$, KOH and IPA.

8. A process according to claim 1, wherein said mandrel is made from intrinsic polycrystalline silicon.

9. A process according to claim 1, further comprising the step, before said step (a), of depositing a barrier layer of material on said surface so as to be positioned beneath the location where said first and second openings are to be formed in said mandrel, wherein said barrier layer is made from a material that is etched at a different rate than said mandrel when subjected to an etching process.

10. A process according to claim 9, wherein said barrier layer is made from silicon nitride, said mandrel is made from intrinsic polycrystalline silicon, and said etching process is a RIE etching process that removes intrinsic polycrystalline silicon faster than silicon nitride.

11. A process according to claim 10, wherein said RIE etching process is performed in a $CHF_3/CF_4/Ar$ ambient.

12. A method of forming a strap coupling a trench capacitor with a diffusion region adjacent the capacitor, the method comprising the steps of:
   (a) providing a substrate having (1) a first surface, (2) a trench extending into the substrate and coupled with the first surface, and (3) a diffusion implant region adjacent the trench that confronts the first surface of the substrate, the diffusion implant region having a selected configuration and a selected impurity concentration, the trench being filled with a semiconductor material;
   (b) forming a mandrel overlying the first surface of the substrate, including portions of the diffusion implant region and the trench;
   (c) forming a first opening in the mandrel so as to expose the semiconductor material filling the trench and the diffusion implant region;
   (d) providing doped semiconductor material in said first opening in the mandrel so as to form a strap that contacts (1) the semiconductor material in the trench, (2) portions of the diffusion implant region confronting the first surface of the substrate and (3) portions of the sidewall of the trench;
   (e) heating the substrate for a time and at a temperature sufficient to cause impurities in the diffusion implant region to diffuse into adjacent regions of the substrate, wherein the configuration and impurity concentration of the diffusion implant region is selected so that after said heating step is completed a diffused region is formed that confronts both the top surface of the substrate contacted by the strap and portions of the sidewall of the trench contacted by the strap; and
   (f) removing the mandrel and replacing it with a solid dielectric material.

13. A method according to claim 12, wherein said step (b) involves providing a mandrel made from intrinsic polycrystalline silicon.

14. A method according to claim 12, wherein said substrate provided in said step (a) includes a first layer of material on the first surface thereof on top of which the mandrel is deposited, with said first layer of material being etchable at a first rate when exposed to a first etching process and at a second, faster, rate when exposed to a second etching process, further wherein said step (c) includes the steps of:
   (i) using the first etching process to remove portions of said mandrel down to said first layer so as to form said opening;
   (ii) using the second etching process to etch away portions of said first layer underlying said opening; and
   (iii) wherein said first etching process is selected so as to etch said mandrel faster than it etches said first layer.

15. A method according to claim 12, further comprising, after said step (b) and before said step (c), the steps of:

(i) planarizing said mandrel;

(ii) forming a second layer of material overlying said mandrel, said second layer of material being removed at a faster rate than said mandrel when subjected to a first etching process;

(iii) etching a second opening through said second layer using said first etching process, wherein said second opening is positioned so as to overlie the portion of said mandrel where said first opening is to be formed.

16. A method according to claim 15, wherein said second layer is silicon nitride, said mandrel is intrinsic polycrystalline silicon and said first etching process is a RIE etch process.

17. A method of forming contacts to conductive elements forming part of a semiconductor structure, the structure including a substrate having a first surface and a plurality of regions of material deposited on said first surface and extending up from said first surface so as to terminate substantially at a common plane, the regions of material being separated so that openings exist therebetween, the method comprising the steps of:

(a) providing a first layer of material (i) on the first surface of the substrate in the openings and (ii) overlying the regions of material;

(b) removing that portion of said first layer of material positioned above the common plane;

(c) providing a second layer of material on top of said first layer of material;

(d) forming at least one first opening extending through said second layer and into said first layer;

(e) depositing a conductive material in said at least one first opening; and (f) removing said first and second layers and depositing a solid dielectric material in at least a portion of the space created by removal of said first layer of material.

18. A method according to claim 17, wherein said steps (a) and (c) involve depositing first and second layers of material made from intrinsic poly-Si.

19. A method according to claim 17, further comprising the step, prior to said step (a), of providing a barrier layer of material overlying the first surface of the substrate and the regions of material, the material of the barrier layer being selected so that said material will be removed more slowly than the material used for said first layer when subjected to a selected etching process.

20. A method according to claim 17, wherein said step (d) involves forming a plurality of first openings in said second and first layers of material so that each of said first openings intersects one of the conductive elements.

21. A method according to claim 17, further comprising the steps, after said step (c) and before said step (d), of (1) providing a third layer of material on top of said second layer of material and (2) forming an opening in said third layer of material overlying the portion of said first and second layers where said at least one first opening is to be formed, wherein said second and third layers of material are made of materials selected so that said third layer will be removed faster than said second layer when subjected to a selected etching process.

22. A method according to claim 21, wherein said step (c) involves depositing a second layer of material made of intrinsic poly-Si, said step of depositing a third layer of material involves depositing a third layer of material made of oxide, and said selected etching process comprises a RIE etch performed in a $CHF_3/CF_4/Ar$ ambient.

23. A method according to claim 17, wherein said steps (a) and (c) involve depositing first and second layers of material made of intrinsic poly-Si and said step (f) involves removing said first and second layers using a RIE etch in a HBr ambient.

24. A method according to claim 17, wherein said steps (a) and (c) involve depositing first and second layers of material made of intrinsic poly-Si and said step (f) involves removing said first and second layers using a wet etch comprising a solution of $H_2O$, KOH and IPA.

* * * * *